United States Patent [19]

Okamoto et al.

[11] Patent Number: 4,710,790
[45] Date of Patent: Dec. 1, 1987

[54] MOS TRANSISTOR

[75] Inventors: Tatsuo Okamoto; Kouji Eguchi; Saburou Oosaki, all of Itami, Japan

[73] Assignee: Mitsubishi Denki Kabushiki Kaisha, Tokyo, Japan

[21] Appl. No.: 627,470

[22] Filed: Jul. 3, 1984

[30] Foreign Application Priority Data

Sep. 26, 1983 [JP] Japan ................. 58-179647

[51] Int. Cl.$^4$ .......................................... H01L 29/78
[52] U.S. Cl. ............................. 357/23.6; 357/55; 357/23.1
[58] Field of Search ............. 357/55, 23.4, 23.6, 357/23.1

[56] References Cited

U.S. PATENT DOCUMENTS 4,243,997  1/1981  Natori .................... 357/55

Primary Examiner—Martin H. Edlow

[57] ABSTRACT

A gate electrode (4') of a MOS transistor is formed in a depression (16) provided in a substrate (1). Source and drain regions (6 and 7) of the MOS transistor are formed in the substrate (1) to be opposed to each other with the gate electrode (4') being located therebetween.

5 Claims, 16 Drawing Figures

MOS TRANSISTOR

BACKGROUND OF THE INVENTION

1. Field of the Invention

The present invention relates to a MOS transistor and particularly relates to a structure of a MOS transistor element in a MOS integrated circuit device.

2. Description of the Prior Art

FIG. 1 is a sectional view showing major steps for explaining a method of manufacturing a conventional MOS field-effect transistor (MOSFET) in a MOS integrated circuit device (MOSIC). First, as shown in FIG. 1A, after an element separating layer (not shown) is selectively formed on a surface of a silicon substrate 1 provided as a semiconductor substrate, a relatively thin gate oxide film 2 is formed as a gate insulating film by a thermal oxidation process or the like and an impurity doping layer 3 for control of threshold voltage of a MOSFET is formed by an ion implantation process or the like. A polycrystal silicon layer 4 as a gate electrode material is formed on the gate oxide film 2 and then is doped with impurity such as phosphorus as required so that resistance may be lowered. On this polycrystal silicon layer 4, a photoresist layer 5 is formed only in desired regions. Subsequently, as shown in FIG. 1B, using the photoresist layer 5 as a mask, the polycrystal silicon layer 4 is selectively etched and removed so as to form a polycrystal silicon gate electrode 4', and then, using this gate electrode 4' as a mask, the substrate 1 is doped with impurity by an ion implantation process, a thermal diffusion process or the like and annealing and driving are suitably applied, whereby a source layer 6 and a drain layer 7 are formed. Then, as shown in FIG. 1B also, for the purpose of protecting the polycrystal silicon gate electrode 4', an oxide film 8 is formed on the surface thereof. Subsequently, as shown in FIG. 1C, an oxide film 9 containing phosphorus and the like is formed for smoothness and insulation of the surface and, then, contact holes 10 and 11 are formed in desired portions by photolithography and etching processes. After that, as shown in FIG. 1D, aluminum wirings 12 and 13 are formed to be in contact with necessary regions (the gate electrode 4' and the drain layer 7 in this example) through the contact holes 10 and 11, respectively. Then, a passivation film 14 is formed over the whole surface and thus, manufacturing of a MOSFET is completed.

The operation of such a MOSFET is well known and the description thereof will not be needed.

The above described conventional MOSFET has advantages that resistance can be made lower according to increase of the amount of diffused impurity at the time of forming the source layer 6 and the drain layer 7 and that, according to increase of the heat treatment temperature and the heat treatment time after ion implantation, impurity introduced in the substrate becomes more activated and the impurity concentration gradient of the source layer 6 and the drain layer 7 in the vicinity of the pn junctions between the source and drain layers 6 and 7 and the substrate 1 becomes smaller, which makes it possible to improve the dielectric strength between the source and drain layers 6 and 7 and the substrate 1.

However, on the other hand, the above described conventional MOSFET has disadvantages that due to the large amount of impurity, the high temperature of heat treatment and the long period of heat treatment, a depth $x_j$ from the surface of the substrate 1 to the source layer 6 and to the drain layer 7 is increased and in particular in case where the channel length is short, the dielectric strength between the source and drain regions is lowered. In addition, the above described conventional MOSFET has disadvantages that since the gate electrode 4' is formed on the substrate 1, the upper surface of the substrate becomes uneven and coating on the portions having level differences such as the aluminum wirings 12 and 13 formed on the upper surface is deteriorated, resulting in possible breakup of the wirings.

It was described that a capacitor is formed into Si substrate, in IEDM 1982, TECHNICAL DIGEST, p. 806, "A CORRUGATED CAPACITOR CELL (ccc) FOR MEGABIT DYNAMIC MOS MEMORIES" by H. Sunami et. al.

SUMMARY OF THE INVENTION

A MOS transistor in accordance with the present invention comprises: a semiconductor substrate having a rectangular depression in cross section formed on one major surface thereof; an insulating film formed at least on the inner bottom and side surfaces of the depression; a gate electrode formed in the depression coated with the insulating film; and a source region and a drain region respectively formed on the major surface of the semiconductor substrate so as to be opposed to each other with the depression being provided therebetween.

Therefore, a primary object of the present invention is to provide a MOS transistor by which dielectric strength between the source and drain regions and between the source and drain regions and the substrate can be enhanced and the surface of the element is made even and there is no fear of breaking or other damage in the wirings formed on the surface.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
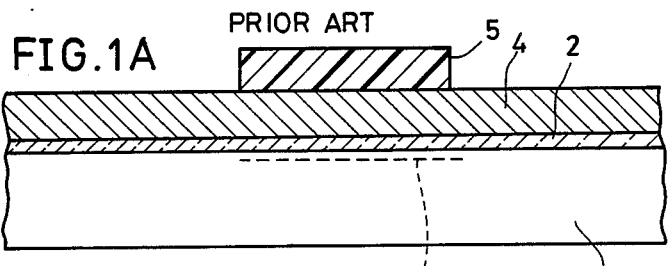
FIG. 1A–1D is a sectional views of a conventional MOSFET and major manufacturing steps thereof.
Figure 1B:
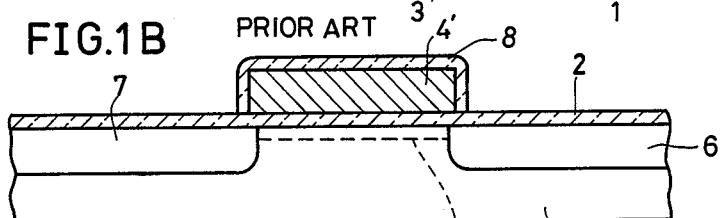
Figure 1C:
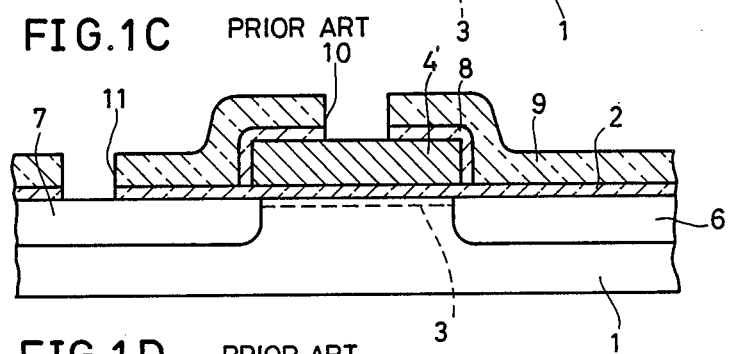
Figure 1D:
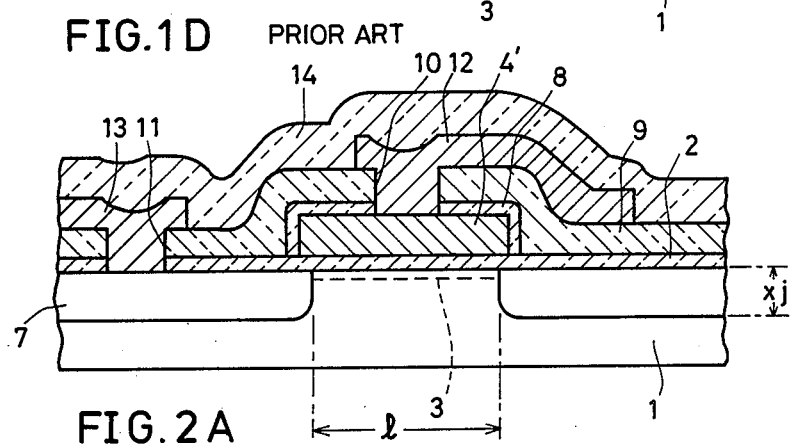
Figure 2A:
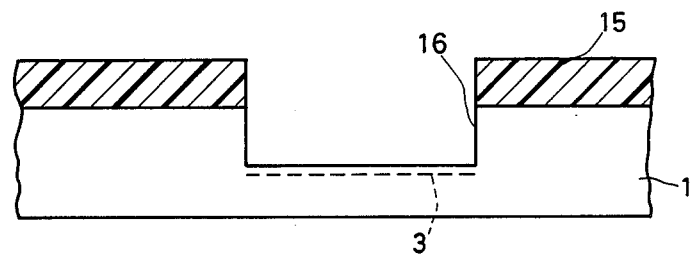
FIG. 2A–2G are sectional views of major manufacturing steps of an embodiment of the present invention for the purpose of affording a better understanding of the structure thereof.
Figure 2B:
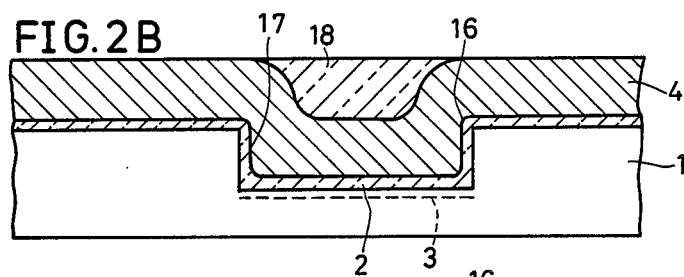
Figure 2C:
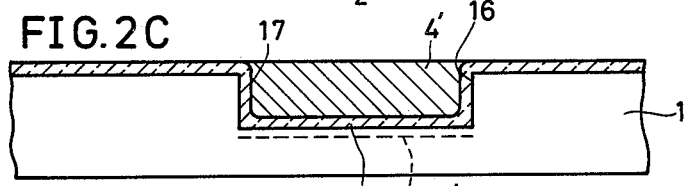
Figure 2D:
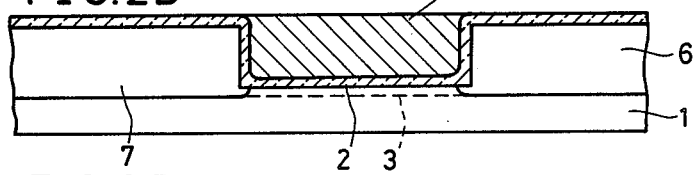
Figure 2E:
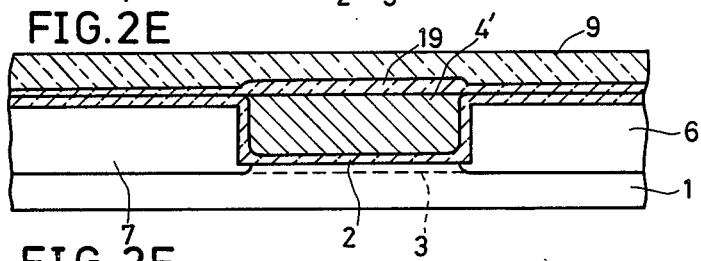
Figure 2F:
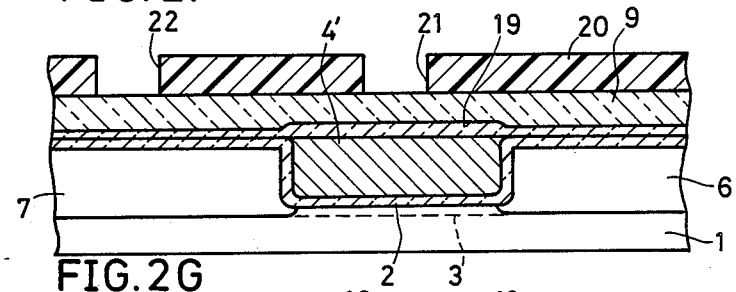
Figure 2G:
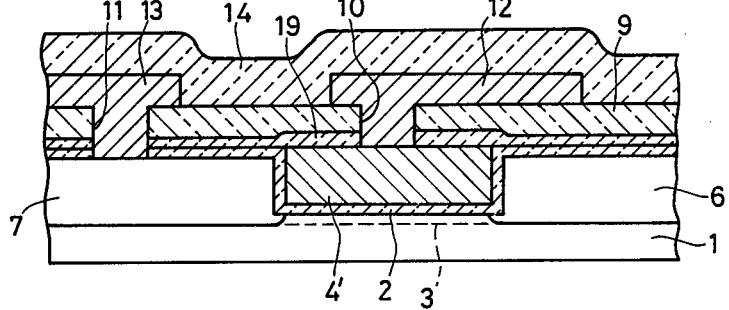

FIG. 2 is a sectional view showing major manufacturing steps of an embodiment of the present invention for the purpose of affording a better understanding of the structure of the embodiment. First, as shown in FIG. 2A, a photoresist layer 15 having an opening for formation of a gate is formed on a major surface of a semiconductor substrate 1. Using this photoresist layer 15 as a mask, etching is applied so that a preferably rectangular depression 16 in cross section having a necessary depth is formed in the semiconductor substrate 1. Subsequently, an impurity doping layer 3 for control of threshold voltage of a MOSFET is formed by an ion implantation process or the like. Then, as shown in FIG. 2B, the photoresist layer 15 is removed and a gate oxide film 2 of a relatively thin thickness is formed over the bottom surface and the inner wall surface of the depression 16 as well as the major surface of the substrate 1. Over this gate oxide film 2 including the depression 17, a polycrystal silicon layer 4 of a thickness larger than the depth of the depression 17 is formed as a gate electrode material by a chemical vapor deposition (CVD) process or the like, and impurity such as phosphorus is introduced as required by a thermal diffusion process or the like so as to decrease resistance. After that, a concavity in the surface is filled with a flattening material 18 such as polyimide, spin on glass or the like and heat treatment is applied thereto in a suitable manner so that the surface is made flat. Subsequently, as shown in FIG. 2C, in a condition where the etching rates of the polycrystal silicon layer 4 and the flattening material 18 are the same, the polycrystal silicon layer 4 and the flattening material 18 are etched and removed except those in the concave portion 17 so that a polycrystal silicon gate electrode 4' is left in the concave portion 17. Then as shown in FIG. 2D, impurity doping is selectively applied by ion implantation or the like and annealing and driving for the introduced impurity are applied by heat treatment so that a source layer 6 and a drain layer 7 are formed. Subsequently, as shown in FIG. 2E, an oxide film 19 of a relatively thin thickness is formed over the gate electrode 4' by a thermal oxidation process, a CDV process or the like so as to serve as an insulating film for protection of the upper surface of the polycrystal silicon gate electrode 4', and on this oxide film 19, a relatively thick oxide film 9 containing phosphorus is formed by a CVD process or the like. After that, as shown in FIG. 2F, a photoresist layer 20 is deposited on the upper surface and openings 21 and 22 are formed in the positions assigned for contact holes. Using this photoresist layer 20 as a mask, etching is applied so that contact holes 10 and 11 are formed to pass through the oxide films 9 and 19 on the gate electrode 4' and the oxide films 9, 19 and 2 on the drain layer 7, respectively, as shown in FIG. 2G. Subsequently, in the same manner as in the above described conventional MOSFET aluminum wirings 12 and 13 and a passivation film 14 are formed and thus, manufacturing of a MOSFET of this embodiment is completed.

In the above described embodiment, the polycrystal silicon gate electrode 4' is embedded within the rectangular depression provided in the surface of the substrate 1 and accordingly, unevenness of the surface due to the thickness of the gate electrode 4' as described previously in conjunction with the conventional MOSFET, never occurs and there is no level difference under the aluminum wirings 12 and 13. Therefore, the wirings can be completely prevented from breakage.

Figure 3:
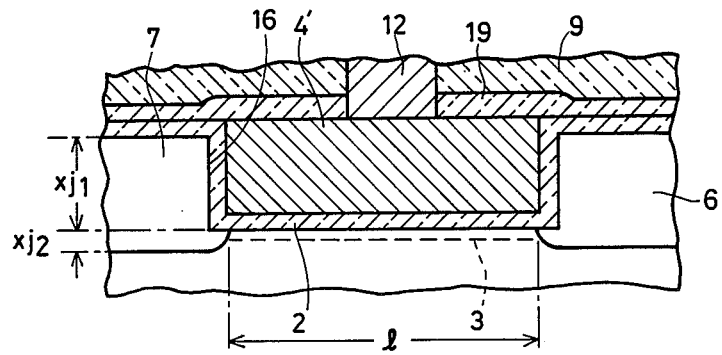
FIG. 3 is an enlarged sectional view showing only the vicinity of a gate electrode of the above stated embodiment.

FIG. 3 is a sectional view showing on an enlarged scale, only the vicinity of the gate electrode of this embodiment. As this embodiment has the above described structure, the depth $x_j$ of the source layer 6 and the drain layer 7 is equal to a sum of a depth $x_{j1}$ from the upper surface of the substrate 1 to the bottom surface of the depression 16 and a depth $x_{j2}$ from the bottom surface of the depression 16 to the lower portion. The depth $x_{j2}$ of the diffused layer affecting the dielectric strength between the source and drain regions of the MOSFET can be decreased and, accordingly, lowering of the dielectric strength between the source and drain regions can be prevented. The depth $x_j$ of the source layer 6 and the drain layer 7 is represented by an equation: $x_j = x_{j1} + x_{j2}$. It can be made larger than in a conventional device and, therefore, has the advantages in that it is made possible to increase the impurity amount, the heat treatment time and the temperature at the time of forming the source layer 6 and the drain layer 7. In addition, since the junction between the source and drain layers 6 and 7 and the substrate 1 can be formed deeply with respect to the upper surface of the substrate 1, the impurity concentration gradient in the vicinity of the junction can be made smaller and, as a result, the dielectric strength between the source and drain layers 6 and 7 and the substrate 1 can be improved.

Figure 4A:
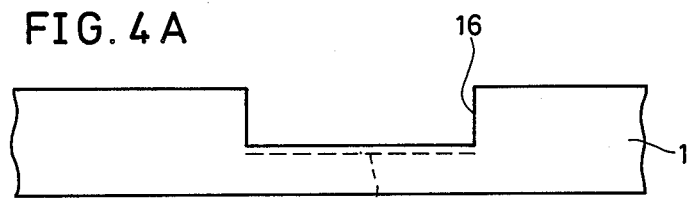
FIG. 4A–4D are sectional views of only essential parts of a manufacturing process of another embodiment of the present invention.
Figure 4B:
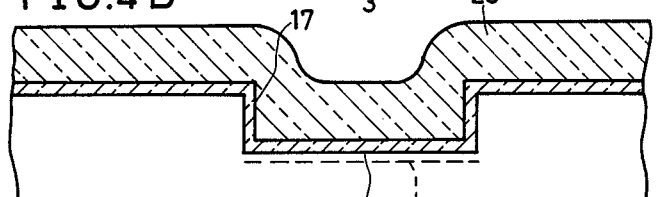
Figure 4C:
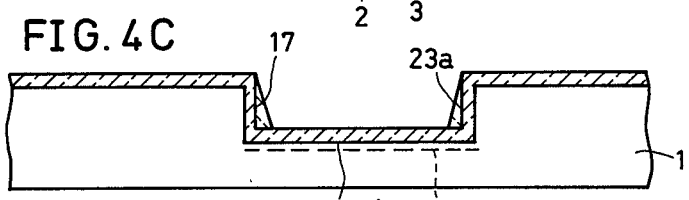
Figure 4D:
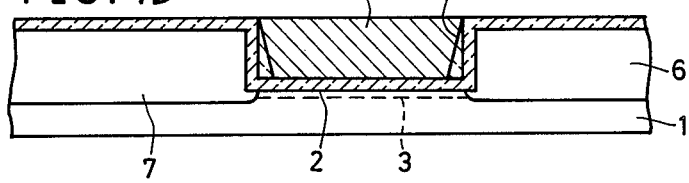

In the above described embodiment, the gate electrode 4' and the source and drain layers 6 and 7 are in contact only through the thin gate oxide film 2 and, as a result, the parasitic capacity between them might be increased, affecting unfavorably the operating speed of the element. FIG. 4 is a sectional view showing essential parts of a manufacturing process of another embodiment of the present invention in which improvement is made as to the above described point. First, as shown in FIG. 4A, a depression 16 and an impurity doping layer 3 are formed in the semiconductor substrate 1. After that, as shown in FIG. 4B, a gate oxide film 2 is formed and an oxide layer 23 as an insulating layer is then formed over the surface including the depression portion 17 by a CVD process or the like. Subsequently, as shown in FIG. 4C, anisotropic etching is applied in the vertical direction so that an oxide film 23a as an insulating film remains in a side wall portion of the depression 17. After that, in the same manner as in the steps of FIGS. 2B and 2C, a gate electrode 4' is formed as shown in FIG. 4D. Thus, the parasitic capacity between the gate electrode 4' and the source and drain layers 6 and 7 can be decreased.

As a material for the gate electrode, instead of polycrystal silicon as described above, a metal of high melting point, silicide thereof or a material comprising two layers of polysilicon and silicide may be used.

As described above in detail, since in a MOS transistor in accordance with the present invention, the gate electrode is formed in the depression provided in the substrate, the dielectric strength between the source and drain regions and the dielectric strength between the substrate and the source and drain regions can be increased and there is no fear of breaking of the wirings since the surface is made flat.

Although the present invention has been described and illustrated in detail, it is clearly understood that the same is be way of illustration and example only and is not to be taken by way of limitation, the spirit and scope of the present invention being limited only by the terms of the appended claims.

What is claimed is:

1. A MOS transistor comprising:
   a semiconductor substrate having a depression formed on one major surface thereof;
   an insulating film formed at least on an inner bottom surface and a side surface of said depression;
   a gate electrode formed in said depression coated with said insulating film; and
   a source region and a drain region formed in said major surface of said semiconductor substrate so as to be opposed to each other with said depression being located therebetween, wherein substantially the entire upper surface of said gate electrode is generally flat and approximately even with said major surface of said semiconductor substrate and contained substantially entirely within said depression.

2. A MOS transistor in accordance with claim 1, wherein
   a portion of said insulating film on the inner side surface of said depression located between said gate electrode and said source region and a portion of said insulating film on the inner side surface of said depression located between said gate electrode and said drain region are relatively thicker than a portion of said insulating film on the bottom surface of said depression.

3. A MOS transistor in accordance with claim 2, wherein
   said relatively thick portions of said insulating film are formed by anisotropic etching.

4. A MOS transistor in accordance with claim 1, further comprising an impurity doping layer formed in a portion of said semiconductor substrate located under the bottom surface of said depression.

5. A MOS transistor in accordance with claim 1, further comprising:
   an insulation layer formed on said major surface of said semiconductor substrate including the surface of said gate electrode, said insulating layer having a contact hole being provided therein; and
   a wiring made in contact with a desired portion of said gate electrode and said source and drains regions through said contact hole.

* * * * *